United States Patent
Bhatia et al.

(10) Patent No.: US 8,525,716 B2
(45) Date of Patent: Sep. 3, 2013

(54) ISOLATION CIRCUIT FOR A DIGITAL-TO-ANALOG CONVERTER

(75) Inventors: Karan S. Bhatia, Plano, TX (US); Neeraj P. Nayak, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 40 days.

(21) Appl. No.: 13/339,460

(22) Filed: Dec. 29, 2011

(65) Prior Publication Data

US 2013/0169458 A1    Jul. 4, 2013

(51) Int. Cl.
*H03M 1/66* (2006.01)

(52) U.S. Cl.
USPC .......................................... 341/144; 341/135

(58) Field of Classification Search
USPC ................. 341/144, 135, 136, 150; 327/103, 327/108, 65
See application file for complete search history.

(56) References Cited

U.S. PATENT DOCUMENTS

| | | | | |
|---|---|---|---|---|
| 5,638,011 A * | 6/1997 | Nguyen | | 327/108 |
| 6,437,599 B1 * | 8/2002 | Groen | | 326/63 |
| 6,559,784 B1 * | 5/2003 | Schofield et al. | | 341/144 |
| 8,169,353 B2 * | 5/2012 | Seo et al. | | 341/144 |
| 8,212,749 B2 * | 7/2012 | Cho et al. | | 345/82 |

* cited by examiner

*Primary Examiner* — Peguy Jean Pierre
(74) *Attorney, Agent, or Firm* — John R. Pessetto; W. James Brady; Frederick J. Telecky, Jr.

(57) ABSTRACT

An electronic circuit comprises a digital-to-analog converter (DAC) core circuit having a current source device and a digital input bit. An isolation circuit is also provided and is connected to the DAC core circuit. The isolation circuit is configured to selectively provide a source bias signal to the current source device. The isolation circuit also is configured to isolate the source bias signal from the current source device based on a state of the digital input bit.

2 Claims, 4 Drawing Sheets

ISOLATION CIRCUIT FOR A DIGITAL-TO-ANALOG CONVERTER

BACKGROUND

Some types of line drivers, such as 10/100BT Ethernet line drivers, comprise a segmented digital-to-analog converter (DAC) array. Each element of the segmented DAC array includes, among other components and signals, a current source transistor and operates according to a current source bias signal. To generate the output waveform from the segmented DAC, each DAC segment in the array turns on and off in various combinations at a speed of, for example, 500 MHz. Whenever DAC segments are switched off, a glitch may result on the current source input signal to that segment due to large parasitic gate-to-drain capacitance of the current source transistors. Because the current source signal is connected to all of the other DAC segments in the array, the aforementioned glitch is received at all of the segments. These glitches may result in significant overshoots and amplitude modulation beyond the applicable specification limits.

SUMMARY

Some embodiments are directed to an electronic circuit that comprises a digital-to-analog converter (DAC) core circuit having a current source device and a digital input bit. An isolation circuit is also provided and is connected to the DAC core circuit. The isolation circuit is configured to selectively provide a source bias signal to the current source device. The isolation circuit also is configured to isolate the source bias signal from the current source device based on a state of the digital input bit.

Other embodiments are directed to a digital-to-analog converter (DAC) that comprises a plurality of DAC segments interconnected by a source bias line. Each DAC segment has a DAC sub-circuit comprising a current source device and an isolation circuit and is configured to receive a digital input bit. Each isolation circuit coupled to the current source device of each such DAC segment. Each such isolation circuit is configured to provide a source bias signal to the current source device. The isolation circuit is configured to isolate the source bias signal from the current source device based on a state of the digital input bit.

Yet other embodiments are directed to a DAC comprising first and second DAC segments interconnected by a source bias line. Each DAC segment has a DAC core circuit connected to an isolation circuit. The first DAC segment comprises a current source transistor and is configured to receive a pair of digital input bits. The second DAC segment comprises a current source transistor and is configured to receive only one of the pair of single digital input bits. For each DAC segment, that DAC segment's isolation circuit is configured to selectively provide a source bias signal to that DAC segment's current source transistor.

The isolation circuit of the first DAC segment comprises a switch and a logic gate. The logic gate receives the pair of digital input bits. The isolation switch of the first DAC segment is configured to isolate the source bias signal from the current source transistor of the first DAC segment based on an output signal from the logic gate. The output signal depends on the pair of digital input bits. The isolation circuit of the second DAC segment is configured to isolate the source bias signal from the current source transistor of the second DAC segment based on a state of the one digital input bit.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "connect" or "connection" refers to a direct electrical connection between two components. The term "couple" or "couples" means either an indirect or direct electrical connection. Thus, if a first device couples to a second device, that connection may be through a direct electrical connection, or through an indirect electrical connection via other devices and connections. The word "approximately" as used herein means "within 10%." Thus, value of "approximately 100" means 100+/−10%.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
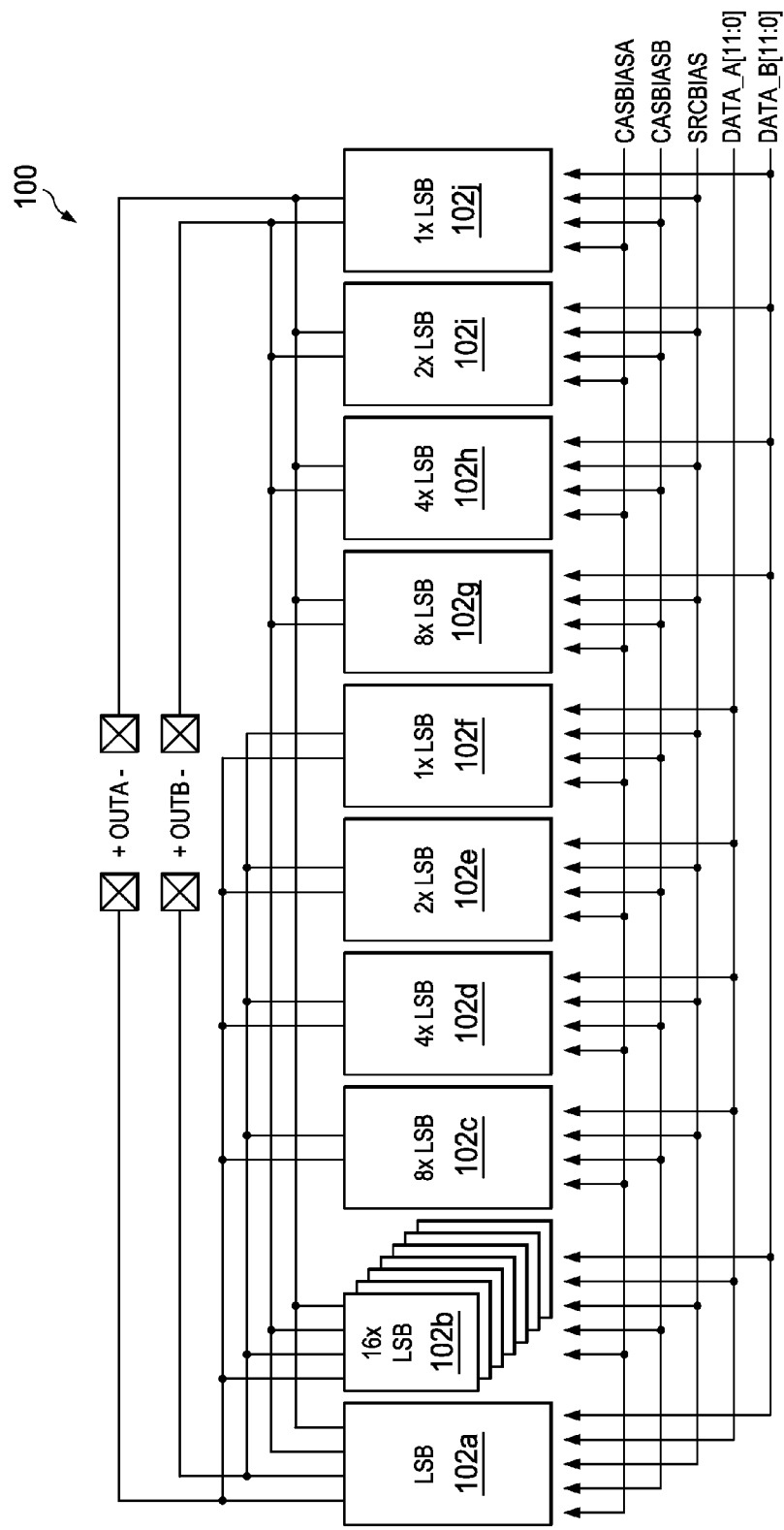
FIG. 1 shows a digital-to-analog converter (DAC) comprising multiple DAC segments in accordance with various embodiments.

FIG. 1 illustrates an example of a digital-to-analog converter (DAC) 100. The DAC 100 in the example of FIG. 1 is an 8-bit converter but can be other than 8 bits in other embodiments. The DAC 100 contains various segments 102 that drive a weighted output current onto either OUTA or OUTB in response to the state of the bits on DATA_A[11:0] and DATA_B[11:0]. CASBIASA, CASBIASB, and Source Bias (SRCBIAS) are lines that carry static voltages, while DATA_A and DATA_B busses change dynamically. Each segment 102 comprises one or more DAC sub-circuits (described below).

The DAC 100 of the example of FIG. 1 generally is divided into 3 sets of segments 102—$128^{th}$ least significant bit (LSB) is segment 102a, seven (or a different number) thermometric-weighted segments 102b, and two sets of 4 binary-weighted segments 102c-102j. One such set of 4 binary-weighted segments comprises segments 102c-102f, while another set comprises segments 102g-102j. Collectively, segments 102a-102j can produce a total of 129 different output current levels on OUTA or OUTB. The extra LSB segment 102a has a weighting of one level, while each thermometric segment 102b has a weighting of 16 levels (or 16×LSB). Each of the 4 binary-weighted segments contains segments with weightings of 8 levels (8×LSB, segment 102c and 102g), 4 levels (4×LSB, 102d and 102h), 2 levels (2×LSB, 102e and 102i), and 1 level (1×LSB, 102f and 102j). All segments 102a-102j are driven by CASBIASA, CASBIASB, and SRCBIAS. The extra LSB (segment 102a) is driven by DATA_A[11] and DATA_B[11]. The seven thermometric segments 102b are driven by DATA_A[10:4] and DATA_B[10:4]. The set of binary-weighted segments 102c-102f is driven by DATA_A[3:0]. The set of binary-weighted segments 102g-102j is driven by DATA_B[3:0]. Within each set of the 4 binary-weighted segments, bit [3] of the respective DATA input drives the 8×LSB. As such DATA_A[3] drives 8×LSB segment 102a and DATA_B[3] drives 8×LSB segment 102g. Similarly, bit[2] of DATA_A and DATA_B drives the 4×LSB of segments 102d and 102h, respectively. Bit[1] of DATA_A and DATA_B drives the 2×LSB of segments 102e and 102i, respectively. Bit[0] of DATA_A and DATA_B drives the 1×LSB of segments 102f and 102j, respectively.

The currents generated by each segment add at the output to create one of 129 current levels based on the number of segments 102 that are turned on at a given time. For example, if DATA_A[11:0]=0111 1111 1111 and DATA_B[11:0] =0000 0000 0000, then the total current of the DAC at the positive terminal of the output would be 127/128 of the full-scale current level, while the negative terminal of the output will draw no current. Similarly, if DATA_A[11:0]=0000 0000 0000 and DATA_B[11:0]=0000 0000 1111, the total current of the DAC at the negative terminal of the output would be 15/128 of the full-scale current level, while the positive terminal of the output will draw no current. The amount of current present on the output terminals of the DAC is in direct response to the state of the digital data busses DATA_A[11:0] and DATA_B[11:0].

Figure 2:
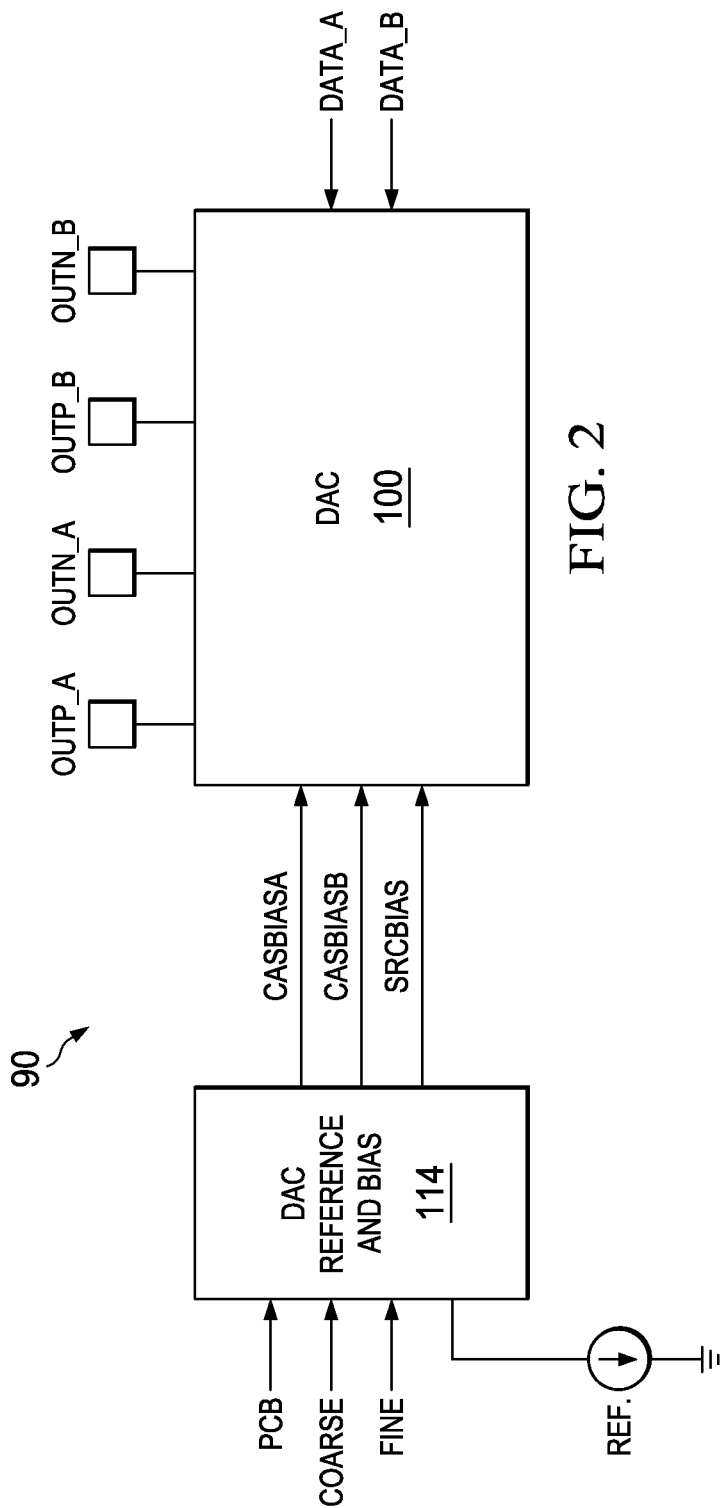
FIG. 2 illustrates a line driver including the DAC of FIG. 1 in accordance with various embodiments.

FIG. 2 shows an embodiment of a line driver 90 that comprises DAC 100 coupled to a DAC reference and bias 114. The DAC reference and bias 114 utilizes a reference current, provided by a bandgap circuit or external source, to generate the CASBIASA, CASBIASB, and SRCBIAS signals for the DAC 100. PCB, COARSE, and FINE input signals are digital busses used to trim the CASBIASA, CASBIASB, and SRCBIAS voltages to optimize DAC performance in the presence of transistor process variability and mismatch.

The source bias signal (SCRBIAS) may be provided to all of the DAC segments 102a-102j in the DAC 100. As noted above, in some DAC systems, both of the digital input bits (DATA_A and DATA_B) becoming low at the same time may cause noise to be generated on the source bias signal due to the drain-to-gate capacitance of a current source transistor internal to a DAC segment. Because SRCBIAS is provided to other DAC segments 102 in the DAC 100, the generated noise is propagated throughout the array and diminishes performance of the array.

Figure 3:
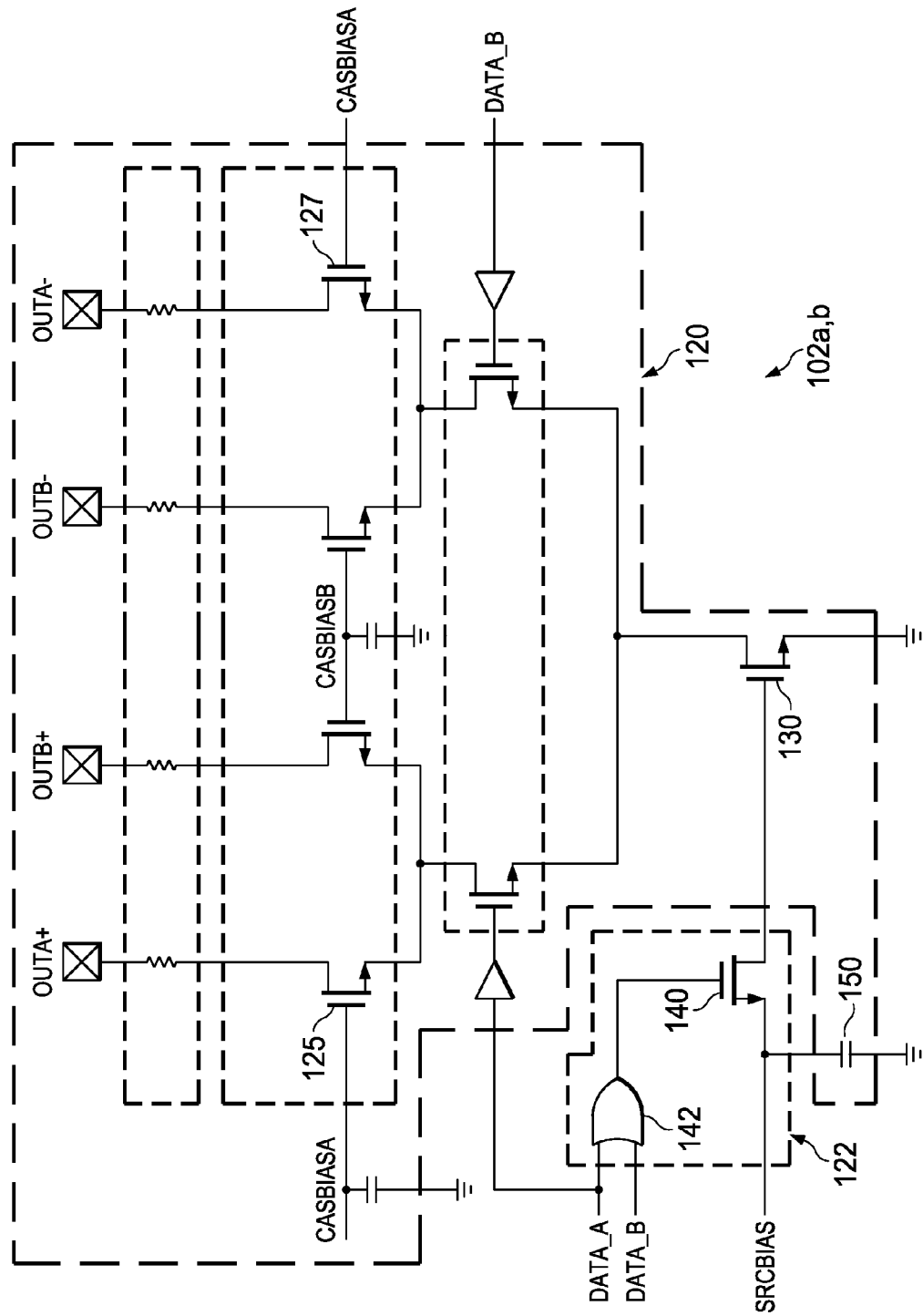
FIG. 3 shows another example of a DAC segment in accordance with various embodiments.

In accordance with an embodiment of the invention, FIG. 3 shows an example of a DAC sub-circuit 102 that may be used to implement one or more of the DAC segments 102a-102b (i.e., the segments that receive both digital input bits as inputs). The illustrative DAC sub-circuit shown in FIG. 3 comprises a DAC core circuit 120 comprising a current source device 130 and is configured to receive a pair of digital input bits (DATA_A and DATA_B). The current source device 130 may comprise an NMOS transistor. The DAC core circuit 120 of FIG. 3 also comprises a transistor pair 125, 127 to which each digital input bit is provided as shown.

The DAC core circuit 120 is used in the thermometric and final segments of the DAC 100. The SRCBIAS, CASBIASA, and CASBIASB signals are static signals generated by the DAC reference and bias 114. CASBIASA and CASBIASB control whether the OUTA+/− or OUTB+/− output paths, respectively, are active. Only one path is active at any given time (i.e. either CASBIASA or CASBIASB can propagate a voltage above ground at any given time while the other propagates a voltage equal to ground). The current source device 130 controlled by SRCBIAS pulls a current proportional to its size from the output to ground. This current is steered toward the OUTA+/OUTB+ side or the OUTA−/OUTB− side of the DAC core circuit 102 in response to the state of the bits on the DATA_A and DATA_B busses. For example, the OUTA+/− path will be ON due to CASBIASA having some static voltage above ground and CASBIASB having a static voltage equal to ground. The current generated by the current source device, in response to SRCBIAS, will be pulled from OUTA+ when the state of the DATA_A bit is HI and the state of the DATA_B bit is LO. Similarly, the current generated by the current source device 130 will be pulled from OUTA− when the state of the DATA_A bit is LO and the state of the DATA_B bit is HI. If DATA_A and DATA_B are both LO, the drain node of the current source device will be quickly pulled to ground, thereby causing a glitch on the SRCBIAS signal.

The DAC sub-circuit 102a,b of FIG. 3 also comprises an isolation circuit 122 connected to the DAC core circuit 120. The isolation circuit 122 includes a switch 140 coupled to a logic gate 142. The logic gate 142 may comprise an OR-gate as shown. The switch 140 connects to the current source device 130. Specifically, the drain of switch 140 connects to the gate of the current source device 130. The output signal from the logic gate 142 connects to and controls the gate of the switch 140. The source bias signal is selectively provided by the isolation circuit 122 to the current source device 130.

The digital input bits (DATA_A and DATA_B) both are provided as inputs to the logic gate 142, which comprises an OR gate (or other suitable logic gate(s)) in the embodiment of FIG. 3. The output signal from the logic gate 142 thus depends on the states of the digital input bits. If either or both of the digital input bits are high, then the output signal of the logic gate 142 is forced high which in turn closes switch 140 thereby permitting the source bias signal to flow through the switch 140 to the gate of the current source device 130.

On the other hand if both of the digital input bits are low, then the output signal of the logic gate 142 is forced low which in turn opens switch 140 thereby preventing the source bias signal to flow through the switch 142 to the current source device 130. The isolation circuit 122 thus selectively isolates the source bias signal from the current source device 130 based on a state of the digital input bits. The transition of the digital input bits to a low state—that is both bits are high then both go low or only one bit is high and that one bit goes low—is when noise would ordinarily be generated on the source bias signal which then would feedback through the DAC100. The introduction of the isolation circuit 122 on the source bias line which detects the very condition that would result in the noise being generated solves the noise problem. The switch 140 in the isolation circuit 122 can open faster than the harmful noise can be generated.

The DAC sub-circuit 102a,b of FIG. 3 also includes a bypass capacitor 150 connected between the source bias signal line and ground as shown. Bypass capacitor 150 helps to filter out some of the high frequency noise on the source bias signal. Without the use of the isolation circuit 122, the bypass capacitor 150 would have to have a relatively large capacitance value in many applications (e.g., a capacitance on the order of 170 picoFarads (pF). Capacitors having such capacitance values are quite large relative to the size of the DACs themselves. With the use of the isolation circuit 122, the capacitance value of bypass capacitor 150 can be much smaller and thus the physical size of the capacitor 150 itself can be much smaller than otherwise would be the case. For example, in some applications, bypass capacitor 150 may have a capacitance value in the range of approximately 10 to 20 pF, and in some applications may have a value of approximately 17 pF.

Figure 4:
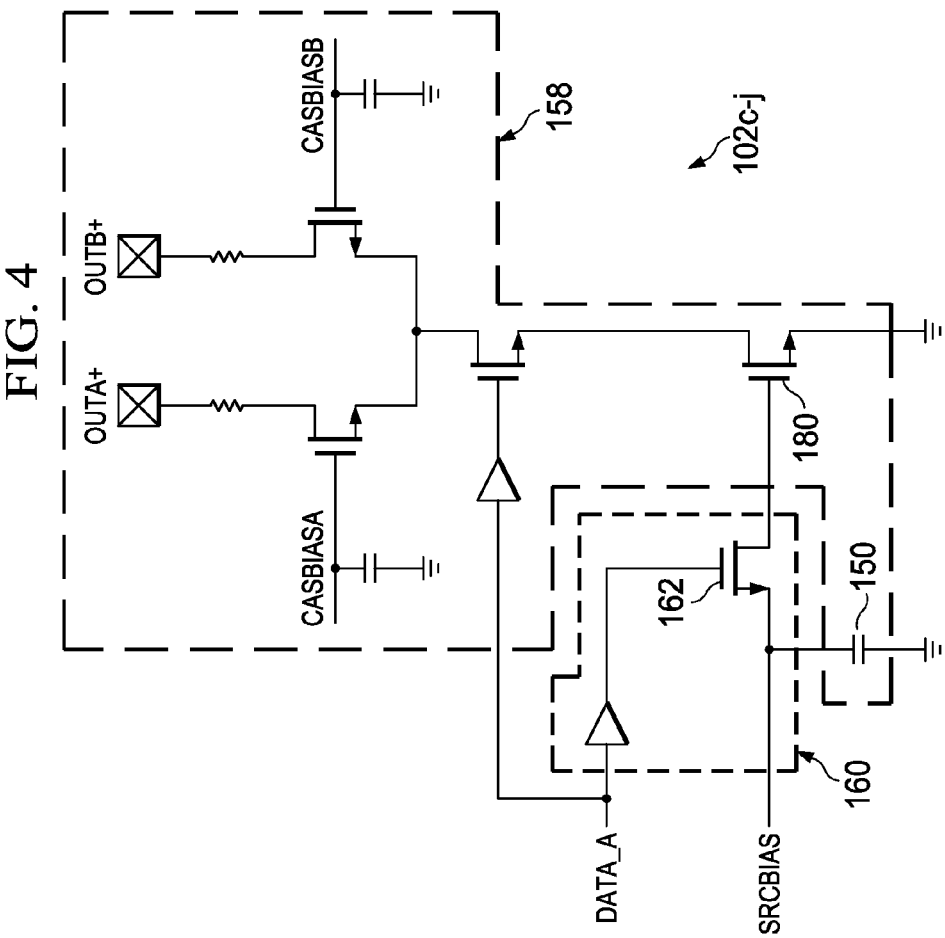
FIG. 4 shows another example of a DAC segment in accordance with various embodiments.

FIG. 4 shows an embodiment of DAC sub-circuit 102c-j. In this embodiment, the DAC segment receives only a single digital input bit (DATA_A in this example) and thus has single-ended operation. DAC sub-circuit 102c-j may be used for DAC segments 102c-102j which provide for one or the other (but not both) of DATA_A and DATA_B as inputs bits. The DAC sub-circuit 102c-j comprises a DAC core circuit 158 coupled to an isolation circuit 160.

The DAC sub-circuit 102c-j of FIG. 4 is used in the binary-weighted segments of the DAC 100. SRCBIAS, CASBIASA, and CASBIASB are static signals generated by the DAC REFERENCE/BIAS. CASBIASA and CASBIASB control whether the OUTA+ or OUTB+ output paths are active, respectively. Only one path is active at any given time (i.e. either CASBIASA or CASBIASB can propagate a voltage above ground at any given time while the other propagates a voltage equal to ground). The current source device controlled by SRCBIAS pulls a current proportional to its size from the output to ground when DATA_A is HI. For example, the OUTA+ path will be ON due to CASBIASA having some static voltage above ground and CASBIASB having a static voltage equal to ground. The current generated by the current source device, in response to SRCBIAS, will be pulled from OUTA+ when the state of the DATA_A bit is HI. If the state of DATA_A is LO, the drain node of the current source device will be quickly pulled to ground, thereby causing a glitch on the SRCBIAS signal.

In the example of FIG. 4, the isolation circuit 160 connects to a current source device 180. The isolation circuit 160 comprises a switch 162 and a driver 164. The switch 162 functions in much the same way as the switch 140 in DAC sub-circuit 102a, b of FIG. 3. Because only one digital input bit is provided as an input to the DAC sub-circuit 102c-j of FIG. 4, the logic gate 142 of FIG. 3 is not needed. Otherwise, the isolation circuit 160 functions in a similar fashion as the isolation circuit 122 of FIG. 3.

The isolation circuits 122, 160 in the embodiments described herein selectively isolate noise that may be generated based on a specific combination of logic values and transitions for the digital input(s). Isolating the noise form the source bias line in this manner helps the DAC array better achieve higher performance operation. The digital input bit(s) is(are) used to control the isolation circuit to isolate the noise from feeding back into the DAC array through the source bias line, and then re-couple the source bias signal to the current source device for digital input bit states that would not result in noise being generated on the source bias line.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A DAC, comprising:
   first and second DAC segments interconnected by a source bias line, each DAC segment having a DAC core circuit connected to an isolation circuit;
   wherein the first DAC segment comprises a current source transistor and is configured to receive a pair of digital input bits and wherein the second DAC segment comprises a current source transistor and is configured to receive only one of said pair of single digital input bits; and
   wherein, for each DAC segment, that DAC segment's isolation circuit is configured to selectively provide a source bias signal to that DAC segment's current source transistor;
   wherein the isolation circuit of the first DAC segment comprises a switch and a logic gate, said logic gate receiving said pair of digital input bits, and said isolation switch of the first DAC segment being configured to isolate the source bias signal from the current source transistor of the first DAC segment based on an output signal from said logic gate, said output signal depending on said pair of digital input bits; and
   wherein the isolation circuit of the second DAC segment is configured to isolate the source bias signal from the current source transistor of the second DAC segment based on a state of the one digital input bit.

2. The DAC array of claim 1 wherein each of the first and second DAC segments comprises a bypass capacitor connected to each respective isolation circuit, said bypass capacitor having a capacitance in a range of 10 to 20 picoFarads (pF).

* * * * *